(12) United States Patent
Chaggares et al.

(10) Patent No.: US 12,390,835 B2
(45) Date of Patent: *Aug. 19, 2025

(54) ULTRASONIC TRANSDUCER

(71) Applicant: RESONANT ACOUSTICS INTERNATIONAL INC., Markham (CA)

(72) Inventors: Nicholas Chris Chaggares, Markham (CA); Eric M. Rieder, Markham (CA); Khachic Karshafian, Markham (CA)

(73) Assignee: RESONANT ACOUSTICS INTERNATIONAL INC., Markham (CA)

( * ) Notice: Subject to any disclaimer, the term of this patent is extended or adjusted under 35 U.S.C. 154(b) by 0 days.

This patent is subject to a terminal disclaimer.

(21) Appl. No.: 18/205,291

(22) Filed: Jun. 2, 2023

(65) Prior Publication Data

US 2023/0302496 A1 Sep. 28, 2023

Related U.S. Application Data

(63) Continuation of application No. 16/527,997, filed on Jul. 31, 2019, now Pat. No. 11,701,689.
(Continued)

(51) Int. Cl.
*B06B 1/06* (2006.01)
*G10K 11/02* (2006.01)
*H10N 30/85* (2023.01)

(52) U.S. Cl.
CPC .............. *B06B 1/067* (2013.01); *G10K 11/02* (2013.01); *H10N 30/852* (2023.02)

(58) Field of Classification Search
CPC ....... H10N 30/852; B06B 1/067; G10K 11/02
See application file for complete search history.

(56) References Cited

U.S. PATENT DOCUMENTS 4,572,981 A    2/1986   Zola
5,142,187 A * 8/1992   Saito ................ B06B 1/0622
                                                310/334

(Continued)

FOREIGN PATENT DOCUMENTS

CN       101524682 A    9/2009
CN       104090032 A    10/2014
(Continued)

OTHER PUBLICATIONS

Japanese Office Action with English translation regarding Application No. 2021-529497 dated Aug. 29, 2023, 11 pages.
(Continued)

*Primary Examiner* — J. San Martin
(74) *Attorney, Agent, or Firm* — Crowell & Moring LLP

(57) ABSTRACT

There are provided an ultrasonic transducer and methods for designing and manufacturing the same. The ultrasonic transducer includes a piezoelectric composite layer configured to be in acoustic communication with a sample and having at least partially decoupled acoustic impedance and electrical impedance properties. The piezoelectric composite layer includes an array of spaced-apart piezoelectric regions, each being made from a piezoelectric material, a filler material positioned between adjacent spaced-apart piezoelectric regions, the filler material comprising a polymer matrix and a non-piezoelectric material in contact with the polymer matrix. In some embodiments, the ultrasonic transducer includes an electrically insulating non-piezoelectric composite layer extending over the piezoelectric composite layer for electrically insulating the piezoelectric composite layer from the sample, the electrically insulating non-piezoelectric composite layer being acoustically matched to the piezoelectric composite layer and the sample.

23 Claims, 6 Drawing Sheets

Related U.S. Application Data

(60) Provisional application No. 62/712,595, filed on Jul. 31, 2018.

(56) References Cited

U.S. PATENT DOCUMENTS

| | | | |
|---|---|---|---|
| 5,548,564 | A | 8/1996 | Smith |
| 5,629,906 | A | 5/1997 | Sudol et al. |
| 6,467,140 | B2 | 10/2002 | Gururaja |
| 11,701,689 | B2 * | 7/2023 | Chaggares .............. B06B 1/067 310/334 |
| 2005/0225211 | A1 | 10/2005 | Oliver |
| 2010/0168582 | A1 | 7/2010 | Yuan et al. |
| 2013/0043768 | A1 | 2/2013 | Cochran et al. |
| 2013/0181577 | A1 | 7/2013 | Min |
| 2013/0315035 | A1 | 11/2013 | Tai |
| 2015/0173625 | A1 | 6/2015 | Chaggares et al. |
| 2017/0065253 | A1 | 3/2017 | Li et al. |

FOREIGN PATENT DOCUMENTS

| | | |
|---|---|---|
| CN | 107920797 A | 4/2018 |
| TW | 201739074 A | 11/2017 |
| WO | WO2014/100690 A1 | 6/2014 |
| WO | WO 2017/040979 A1 | 3/2017 |
| WO | WO2020/024051 A1 | 2/2020 |

OTHER PUBLICATIONS

International Search Report issued for patent application No. PCT/CA2019i051046, Jul. 31, 2019.

International Search Report and Written Opinion regarding PCT/CA2020/051563 dated Feb. 5, 2021, 9 pages.

Extended European Search Report regarding EP19 845 051.2 dated Mar. 17, 2022, 11 pages.

Rathod, "A Review of Acoustic Impedance Matching Techniques for Piezoelectric Sensors and Transducers," Sensors, Jul. 21, 2020, pp. 1-64.

Sundar et al., "Piezoelectric and Dielectric Properties of PZT-Epoxy Composite Thick Films," Academic Journal of Polymer Science, Oct. 4, 2018, pp. 95-109.

Anonymous: "Relative Permittivity—the Dielectric Constant," The Engineering Toolbox, Jan. 1, 2020, 7 pages.

Taiwanese Office Action and Translation of Official Letter regarding 108127392 dated Mar. 3, 2023, 22 pages.

Chinese Office Action with English Machine translation regardingcorresponding Chinese application Application No. 201980049864.3 dated Jan. 16, 2024, 20 pages.

* cited by examiner

ULTRASONIC TRANSDUCER

RELATED PATENT APPLICATION

This application claims priority of patent application U.S. 62/712,595 filed on Jul. 31, 2018, the specification of which is hereby incorporated by reference. This application is Continuation application of patent application U.S. Ser. No. 16/527,997.

TECHNICAL FIELD

The technical field generally relates to the field of acoustic energy and more particularly relates to an ultrasonic transducer, related devices, apparatuses methods and techniques.

BACKGROUND

The transmission of acoustic energy to and from an ultrasonic transducer is at least partially affected by acoustic impedance mismatch, for instance the difference in acoustic impedance between the material(s) included in the ultrasonic transducer (e.g., a piezoceramic) and the material(s) acoustically coupled with the ultrasonic transducer. Generally, when the acoustic impedances between the ultrasonic transducer and the material(s) are matched, the energy transfer between one another is improved.

It is generally known by one skilled in the art that impedance matching techniques exist to improve the transmission efficiency of acoustic waves across different materials. Such impedance matching techniques generally involve a trade-off between bandwidth and efficiency and comes with a certain level of complexity. When a large bandwidth is needed, the ultrasonic transducer design, including the matching systems, turn out to be more complex. Such complexity notably adds costs to the ultrasonic transducer. It is still a challenge to design and implement ultrasonic transducers having a large bandwidth, and so the solutions known in the art are still fundamentally bandwidth limited.

A broad variety of materials are sometimes required to be acoustically coupled with an ultrasonic transducer. Such materials can be used in many industrial and medical applications. Common examples include but are not limited to biological tissue (e.g., human and animal bodies), organic materials (e.g., wood and polymers), inorganic materials (e.g., metals), composite materials (e.g., carbon composites), and ceramics. The abovementioned materials have acoustic impedances that range from approximately 1 Mega-Rayles (MR) to over 60 MR.

The materials to be acoustically coupled with the ultrasonic transducers can be classified in four categories: materials having an acoustic impedance higher than piezoelectric materials (herein referred to as "first category"), materials having an acoustic impedance close to piezoelectric materials (herein referred to as "second category"), materials having an acoustic impedance lower than piezoelectric materials (herein referred to as "third category"), and biological materials having acoustic impedance much lower than most piezoelectric materials (herein referred to as "fourth category").

Examples of first category materials are, for example and without being limitative, tungsten, molybdenum, nickel, and gold. These materials have an acoustic impedance of over about 45 MR. Examples of second category materials are, for example and without being limitative, brass, silver, zirconium, and cast iron. These materials have an acoustic impedance between about 30 MR and about 40 MR. Examples of third category materials are, for example and without being limitative, magnesium, aluminum, indium, titanium, and tin. These materials have an acoustic impedance ranging from about 10 MR to about 30 MR. Examples of fourth category materials are, for example and without being limitative, fat, muscle, or organs. These materials typically have acoustic impedance between about 1.2 MR and about 1.8 MR. Bone is another example of fourth category material and can have an acoustic impedance of between about 5 MR and about 8 MR. It is however to be noted that this value can vary greatly.

There is still a need for techniques, apparatus, devices and methods that alleviate or mitigate the problems of prior art.

SUMMARY

In accordance with one aspect, there is provided an ultrasonic transducer, including a piezoelectric composite layer configured to be in acoustic communication with a sample and having at least partially decoupled acoustic impedance and electrical impedance properties, the piezoelectric composite layer including an array of spaced-apart piezoelectric regions, each spaced-apart piezoelectric region being made from a piezoelectric material having a first acoustic impedance and a first electrical relative permittivity; a filler material positioned between adjacent spaced-apart piezoelectric regions, the filler material including a polymer matrix having a second acoustic impedance and a second electrical permittivity, the second acoustic impedance being smaller than the first acoustic impedance, and the second relative permittivity being smaller than the first relative permittivity; and a non-piezoelectric material in contact with the polymer matrix, the non-piezoelectric material having a third acoustic impedance and a third relative permittivity, the third acoustic impedance being greater than the second acoustic impedance, and the third relative permittivity being smaller than the first relative permittivity; and one or more electrodes in electrical communication with the piezoelectric composite layer.

In some embodiments, the piezoelectric composite layer is configured to generate a probing acoustic signal towards the sample; and the one or more electrodes are operable to send a probing electrical signal to the piezoelectric composite layer, thereby generating the probing acoustic signal.

In some embodiments, the piezoelectric composite layer is configured to receive a sample acoustic signal emanating from the sample, thereby generating a sample electrical signal towards the one or more electrodes, the sample electrical signal being representative of the sample acoustic signal.

In some embodiments, the polymer matrix is made from epoxy.

In some embodiments, the non-piezoelectric material is hafnium oxide powder.

In some embodiments, the ultrasonic transducer further includes one or more electrically insulating regions positioned between adjacent spaced-apart piezoelectric regions, the one or more electrically insulating regions being in contact with the filler material.

In some embodiments, the one or more electrically insulating regions have a fourth acoustic impedance and a fourth relative permittivity, the fourth acoustic impedance being close to the first acoustic impedance, and the fourth relative permittivity being smaller than the first relative permittivity.

In some embodiments, the one or more electrically insulating regions are made from ceramic.

In some embodiments, the one or more electrically insulating regions are made from glass.

In some embodiments, the one or more electrically insulating regions have an elongated shape.

In some embodiments, the one or more electrically insulating regions define bar-shaped electrically insulating regions.

In some embodiments, the one or more electrically insulating regions define pillar-shaped electrically insulating regions.

In some embodiments, the ultrasonic transducer further includes the one or more electrically insulating regions are spherical.

In some embodiments, the non-piezoelectric material is embedded within the polymer matrix.

In some embodiments, the piezoelectric material is continuous along one direction; and the filler material is continuous along three directions.

In some embodiments, the piezoelectric material is continuous along two directions; and the filler material is continuous along two directions.

In some embodiments, the piezoelectric material is selected from the group consisting of: ferroelectric materials, single crystal ferroelectric materials, lead free ferroelectric materials and piezoelectric polymeric materials.

In some embodiments, the piezoelectric material is lead zirconate titanate (PZT).

In some embodiments, the acoustic impedance property ranges from about 15 MR to about 30 MR.

In some embodiments, the first acoustic impedance ranges from about 30 MR to about 40 MR.

In some embodiments, the third acoustic impedance ranges from about 7 MR to about 8 MR.

In some embodiments, the piezoelectric composite layer is acoustically matched with the sample and is electrically insulated from the sample.

In some embodiments, the ultrasonic transducer further includes a backing layer in electrical communication with the one or more electrodes.

In some embodiments, the backing layer is a de-matching layer.

In some embodiments, the ultrasonic transducer further includes a ground electrode.

In some embodiments, the ground electrode is configured as a heat spreader.

In some embodiments, the piezoelectric composite layer and the sample defines an acoustic path therebetween, the ultrasonic transducer further including a near lossless acoustically matched layer positioned along the acoustic path, between the piezoelectric composite layer and the sample.

In some embodiments, the ultrasonic transducer further includes a wear layer, the wear layer being acoustically matched with the piezoelectric composite layer.

In some embodiments, the piezoelectric composite layer has a thickness of approximately 2400 microns.

In some embodiments, each spaced-apart piezoelectric region is spaced by 200 microns one from another and has a square cross-section, the square cross-section being 1000 microns by 1000 microns.

In some embodiments, the piezoelectric composite layer has a piezoelectric volume fraction ranging from about 70% to about 80%.

In some embodiments, the ultrasonic transducer further includes an electrically insulating housing for containing the piezoelectric composite layer therein.

In accordance with another aspect, there is provided an ultrasonic transducer for emitting an acoustic signal towards a target, the ultrasonic transducer including a piezoelectric composite layer having at least partially decoupled acoustic impedance and electrical impedance properties, the piezoelectric composite layer including: an array of spaced-apart piezoelectric regions, each spaced-apart piezoelectric region being made from a piezoelectric material having a first acoustic impedance and a first electrical relative permittivity; a filler material positioned between adjacent spaced-apart piezoelectric regions, the filler material including a polymer matrix having a second acoustic impedance and a second electrical permittivity, the second acoustic impedance being smaller than the first acoustic impedance, and the second relative permittivity being smaller than the first relative permittivity; and a non-piezoelectric material in contact with the polymer matrix, the non-piezoelectric material having a third acoustic impedance and a third relative permittivity, the third acoustic impedance being greater than the second acoustic impedance, and the third relative permittivity being smaller than the first relative permittivity; and one or more electrodes in electrical communication with the piezoelectric composite layer, the one or more electrodes being operable to send an electrical signal to the piezoelectric composite layer, thereby generating the acoustic signal towards the target.

In some embodiments, the polymer matrix is made from epoxy.

In some embodiments, the non-piezoelectric material is hafnium oxide powder.

In some embodiments, the ultrasonic transducer further includes one or more electrically insulating regions positioned between adjacent spaced-apart piezoelectric regions, the one or more electrically insulating regions being in contact with the filler material.

In some embodiments, the one or more electrically insulating regions have a fourth acoustic impedance and a fourth relative permittivity, the fourth acoustic impedance being close to the first acoustic impedance, and the fourth relative permittivity being smaller than the first relative permittivity.

In some embodiments, the one or more electrically insulating regions are made from ceramic.

In some embodiments, the one or more electrically insulating regions are made from glass.

In some embodiments, the one or more electrically insulating regions have an elongated shape.

In some embodiments, the one or more electrically insulating regions define bar-shaped electrically insulating regions.

In some embodiments, the one or more electrically insulating regions define pillar-shaped electrically insulating regions.

In some embodiments, the one or more electrically insulating regions are spherical.

In some embodiments, the non-piezoelectric material is embedded within the polymer matrix.

In some embodiments, the piezoelectric material is continuous along one direction; and the filler material is continuous along three directions.

In some embodiments, the piezoelectric material is continuous along two directions; and the filler material is continuous along two directions.

In some embodiments, the piezoelectric material is selected from the group consisting of: ferroelectric materials, single crystal ferroelectric materials, lead free ferroelectric materials and piezoelectric polymeric materials.

In some embodiments, the piezoelectric material is lead zirconate titanate (PZT).

In some embodiments, the acoustic impedance property ranges from about 15 MR to about 30 MR.

In some embodiments, the first acoustic impedance ranges from about 30 MR to about 40 MR.

In some embodiments, the third acoustic impedance ranges from about 7 MR to about 8 MR.

In some embodiments, the piezoelectric composite layer is acoustically matched with the sample and is electrically insulated from the sample.

In some embodiments, the ultrasonic transducer further includes a backing layer in electrical communication with the one or more electrodes.

In some embodiments, the backing layer is a de-matching layer.

In some embodiments, the ultrasonic transducer further includes a ground electrode.

In some embodiments, the ground electrode is configured as a heat spreader.

In some embodiments, the piezoelectric composite layer and the sample defines an acoustic path therebetween, the ultrasonic transducer further including a near lossless acoustically matched layer positioned along the acoustic path, between the piezoelectric composite layer and the sample.

In some embodiments, the ultrasonic transducer further includes a wear layer, the wear layer being acoustically matched with the piezoelectric composite layer.

In some embodiments, the piezoelectric composite layer has a thickness of approximately 2400 microns.

In some embodiments, each spaced-apart piezoelectric region is spaced by 200 microns one from another and has a square cross-section, the square cross-section being 1000 microns by 1000 microns.

In some embodiments, the piezoelectric composite layer has a piezoelectric volume fraction ranging from about 70% to about 80%.

In some embodiments, the ultrasonic transducer further includes an electrically insulating housing for containing the piezoelectric composite layer therein.

In accordance with another aspect there is provided an ultrasonic transducer, including a piezoelectric composite layer configured to be in acoustic communication with a sample and having at least partially decoupled acoustic impedance and electrical impedance properties, the piezoelectric composite layer including: an array of spaced-apart piezoelectric regions, each spaced-apart piezoelectric region being made from a piezoelectric material; a filler material positioned between adjacent spaced-apart piezoelectric regions, the filler material including a polymer matrix; and a non-piezoelectric material in contact with the polymer matrix; an electrically insulating non-piezoelectric composite layer extending over the piezoelectric composite layer for electrically insulating the piezoelectric composite layer from the sample, the electrically insulating non-piezoelectric composite layer being acoustically matched to the piezoelectric composite layer and the sample; and one or more electrodes in electrical communication with the piezoelectric composite layer.

In some embodiments, the electrically insulating non-piezoelectric composite layer includes high acoustic impedance electrically insulating material regions in contact with a second polymer matrix, the second polymer matrix being filled with a high density electrically insulating powder.

In some embodiments, the electrically insulating non-piezoelectric composite layer includes electrically insulating ceramic regions in contact with a second polymer matrix, the second polymer matrix being filled with a high density electrically insulating ceramic powder In some embodiments, the electrically insulating non-piezoelectric composite layer includes electrically insulating glass regions in contact with a second polymer matrix, the second polymer matrix being filled with a high density electrically insulating ceramic powder In some embodiments, the electrically insulating non-piezoelectric composite layer is in a 1 3 configuration.

In some embodiments, the electrically insulating non-piezoelectric composite layer is in a 2 2 configuration.

In some embodiments, the piezoelectric composite layer is configured to generate a probing acoustic signal towards the sample; and the one or more electrodes are operable to send a probing electrical signal to the piezoelectric composite layer, thereby generating the probing acoustic signal.

In some embodiments, the piezoelectric composite layer is configured to receive a sample acoustic signal emanating from the sample, thereby generating a sample electrical signal towards the one or more electrodes, the sample electrical signal being representative of the sample acoustic signal.

In some embodiments, the polymer matrix is made from epoxy.

In some embodiments, the non-piezoelectric material is hafnium oxide powder.

In some embodiments, the ultrasonic transducer further includes one or more electrically insulating regions positioned between adjacent spaced-apart piezoelectric regions, the one or more electrically insulating regions being in contact with the filler material.

In some embodiments, the one or more electrically insulating regions have a fourth acoustic impedance and a fourth relative permittivity, the fourth acoustic impedance being close to the first acoustic impedance, and the fourth relative permittivity being smaller than the first relative permittivity.

In some embodiments, the one or more electrically insulating regions are made from ceramic.

In some embodiments, the one or more electrically insulating regions are made from glass.

In some embodiments, the one or more electrically insulating regions have an elongated shape.

In some embodiments, the one or more electrically insulating regions define bar-shaped electrically insulating regions.

In some embodiments, the one or more electrically insulating regions define pillar-shaped electrically insulating regions.

In some embodiments, the one or more electrically insulating regions are spherical.

In some embodiments, the non-piezoelectric material is embedded within the polymer matrix.

In some embodiments, the piezoelectric material is continuous along one direction; and the filler material is continuous along three directions.

In some embodiments, the piezoelectric material is continuous along two directions; and the filler material is continuous along two directions.

In some embodiments, the piezoelectric material is selected from the group consisting of: ferroelectric materials, single crystal ferroelectric materials, lead free ferroelectric materials and piezoelectric polymeric materials.

In some embodiments, the piezoelectric material is lead zirconate titanate (PZT).

In some embodiments, the acoustic impedance property ranges from about 15 MR to about 30 MR.

In some embodiments, the first acoustic impedance ranges from about 30 MR to about 40 MR.

In some embodiments, the third acoustic impedance ranges from about 7 MR to about 8 MR.

In some embodiments, the piezoelectric composite layer is acoustically matched with the sample and is electrically insulated from the sample.

In some embodiments, the ultrasonic transducer further includes a backing layer in electrical communication with the one or more electrodes.

In some embodiments, the backing layer is a de-matching layer.

In some embodiments, the ultrasonic transducer further includes a ground electrode.

In some embodiments, the ground electrode is configured as a heat spreader.

In some embodiments, the piezoelectric composite layer and the sample defines an acoustic path therebetween, the ultrasonic transducer further including a near lossless acoustically matched layer positioned along the acoustic path, between the piezoelectric composite layer and the sample.

In some embodiments, the ultrasonic transducer further includes a wear layer, the wear layer being acoustically matched with the piezoelectric composite layer.

In some embodiments, the piezoelectric composite layer has a thickness of approximately 2400 microns.

In some embodiments, each spaced-apart piezoelectric region is spaced by 200 microns one from another and has a square cross-section, the square cross-section being 1000 microns by 1000 microns.

In some embodiments, the piezoelectric composite layer has a piezoelectric volume fraction ranging from about 70% to about 80%.

In some embodiments, the ultrasonic transducer further includes an electrically insulating housing for containing the piezoelectric composite layer therein.

Other embodiments are provided below.

In accordance with another aspect, there are provided techniques, devices, apparatuses and methods to independently adjust the electrical and acoustic impedance of a piezocomposite material. A device and method allowing one to decouple the electrical and acoustic impedance of a piezocomposite device can be embodied by a piezocomposite incorporating three (3) materials, rather than the traditional two (2) materials. Decoupling the manipulation of the acoustic impedance of the composite separately from the electrical impedance is provided through the use of a high-acoustic impedance material such as non-piezoelectric ceramic, in addition to a typically relatively low acoustic impedance kerf filler and a piezoelectric material. In some embodiments, the non-piezoelectric ceramic is alumina.

In accordance with another aspect, there is provided an ultrasound transducer for use with target materials having an acoustic impedance in the range of about 15 MR to about 30 MR. The ultrasound transducer includes a complete acoustic path, extending from a piezoelectric element to the target material or device under test (DUT). The ultrasound transducer includes a piezoelectric layer incorporating the piezoelectric element, a ground electrode, thermal management layer(s), electrically insulating layers and outer wear surfaces that can be tailored to the acoustic impedance of the target material to be insonated. The ultrasound transducer provided requires no acoustic impedance matching layers to be used, making the solution equally efficient at all frequencies below an upper cut off frequency. The upper cut off frequency is limited only by the composite design parameters required to achieve effective behavior of the elements of the composite materials, resulting in a practical bandwidth form near DC to an upper cut-off frequency of at least several multiples of the designed center frequency of the device.

In accordance with another aspect, there is provided an ultrasound transducer for use with materials having an acoustic impedance in the range of about 15 MR to about 30 MR. This ultrasound transducer includes an acoustically matched composite. Since the ultrasound transducer does not use matching layers, the ultrasound transducer bandwidth is limited only by the inherent bandwidth imposed by the design and selection of materials comprising the piezoelectric element.

In some embodiments, the ultrasound transducer includes a thermally robust backing layer that can be also configured as a heat spreader on the proximal side of the piezoelectric layer. In some embodiments, the backing layer may also function as a de-matching layer.

In some embodiments, the ultrasound transducer includes a high acoustic impedance kerf fill design. The high acoustic impedance kerf fill design allows for tailoring of the piezoelectric element to various materials having acoustic impedance in the range of 15 to 30 MR. Materials having an acoustic impedance range of about 15 MR to about 30 MR include, but are not limited to, titanium, aluminum, tin, lead, zirconium, some ceramics and composite materials. For the group of materials having an acoustic of impedance of about 15 MR to 30 MR, the ultrasound transducer offers a means of efficiently coupling very broadband ultrasound into these materials.

In some embodiments, the ultrasound transducer includes a piezo composite layer designed to match the acoustic impedance of the DUT, as well as a non-piezoelectric electrically insulating composite layer designed to match the acoustic impedance of the DUT. The non-piezoelectric layer being interposed between the piezo composite layer and the DUT. This non-piezocomposite layer providing an efficient broad bandwidth acoustic path from the piezocomposite transducer element of the DUT while also providing electrical insulation between the transducer and the DUT.

In some embodiments, the ultrasound transducer electrical impedance and acoustic impedance are independently configurable, or at least partially decoupled. The electrical impedance, acoustic impedance, or both may be configured through the use of hybrid non-piezoelectric/piezoelectric composite construction.

In some embodiments, the ultrasound transducer may be configured as a single element, a kerfless annular array, a kerfed annular array, a kerfed linear array, a kerfless linear array, a kerfless 2D matrix array, or a kerfed 2D matrix array In accordance with another aspect, there is provided a method of manufacturing the piezoelectric layer having a tailored acoustic impedance.

Other features and advantages of the present description will become more apparent upon reading of the following non-restrictive description of specific embodiments thereof, given by way of example only with reference to the accompanying drawings.

DETAILED DESCRIPTION

Figure 1:
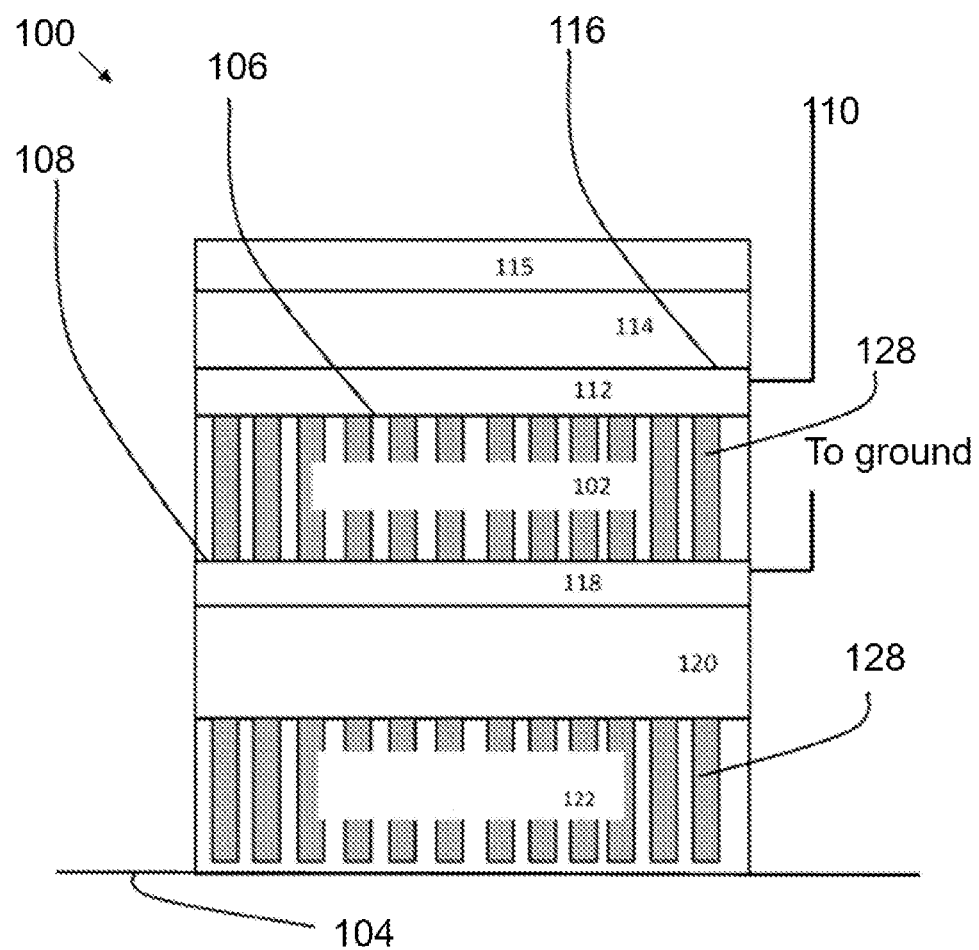
FIG. 1 illustrates a cross-sectional view of an ultrasonic transducer, in accordance with one embodiment.

In the following description, similar features in the drawings have been given similar reference numerals, and, to not unduly encumber the figures, some elements may not be indicated on some figures if they were already identified in one or more preceding figures. It should also be understood herein that the elements of the drawings are not necessarily depicted to scale, since emphasis is placed upon clearly illustrating the elements and structures of the present embodiments. The terms "a", "an" and "one" are defined herein to mean "at least one", that is, these terms do not exclude a plural number of elements, unless stated otherwise. It should also be noted that terms such as "substantially", "generally" and "about", that modify a value, condition or characteristic of a feature of an exemplary embodiment, should be understood to mean that the value, condition or characteristic is defined within tolerances that are acceptable for the proper operation of this exemplary embodiment for its intended application.

In the present description, the terms "connected", "coupled", and variants and derivatives thereof, refer to any connection or coupling, either direct or indirect, between two or more elements. The connection or coupling between the elements may be acoustical, mechanical, physical, optical, operational, electrical, wireless, or a combination thereof.

It will be appreciated that positional descriptors indicating the position or orientation of one element with respect to another element are used herein for ease and clarity of description and should, unless otherwise indicated, be taken in the context of the figures and should not be considered limiting. It will be understood that spatially relative terms (e.g., "outer" and "inner", "outside" and "inside", "periphery" and "central", and "top" and "bottom") are intended to encompass different positions and orientations in use or operation of the present embodiments, in addition to the positions and orientations exemplified in the figures.

General Theoretical Overview

There are many methods and materials that can be used to produce electromechanical acoustic transducers. Some examples include piezoelectric crystals, ferroelectric ceramics, ferroelectric single crystals, ferroelectric polymers, capacitive micromachined ultrasonic transducers (CMUTs), piezoelectric micromachined ultrasonic transducers (PMUTs), and dynamic coil-based systems.

A broad category of relatively high-performance piezoelectric materials is referred to as ferroelectric materials. Ferroelectric materials are some of the most commonly used piezoelectric materials in acoustic transducers, such as ultrasonic transducers. Ferroelectric materials typically have acoustic impedance characteristics ranging from about 30 MR to about 40 MR. For instance, one of the most common ferroelectric ceramics, a family of formulations generally known as lead zirconate titanate (PZT) typically has an acoustic impedance in the range of about 33 MR to about 35 MR. Another category of relatively high-performance piezoelectric materials are single crystal ferroelectric materials, which includes, for example and without being limitative, lithium niobate (PMN-PT or PIN-PMN-PT). These single crystal ferroelectric materials have an acoustic impedance in the range of about 30 MR to about 35 MR. Yet another category includes the emerging lead free ferroelectric materials, such as for example and without being limitative, $(K_{0.5}Na_{0.5})NbO_3$ (KNN) and $(K_{0.48}Na_{0.52})_{0.96}Li_{0.04}Nb_{0.85}Ta_{0.15}O_3$ (KNLNT). These materials have an acoustic impedance of about 31 MR which is slightly lower than most variants of PZT. Yet another example category of piezoelectric materials includes piezoelectric polymers such as PVDF and copolymers such as P(VDF-TrFE). These polymer-based ferroelectric materials have much lower electromechanical efficiency than relaxor-based single crystals and ceramics, however, they have very low acoustic impedance and unique properties that are often well suited to perform as receivers in immersion-based systems.

Despite of a wide variety of potential piezoelectric materials, there remains a dominant category of PZT and related relaxor-based ferroelectric materials that outperform most other materials by a sufficient margin to relegate other piezoelectric materials to niche applications. As a result, most transducers rely on piezoelectric materials that have a very similar acoustic impedance falling in a small range from about 33 MR to about 38 MR. Ultrasonic transducers based on a piezoelectric material having an acoustic impedance that closely matches the material being insonated improves the efficiency of the system, whether by reducing matching requirements, or increasing overall transmission efficiency and bandwidth. Some piezoelectric materials are acoustically well matched to some materials. However, there is a need to insonate, ultrasonically inspect and/or test many materials for which there is no suitable acoustically matched transducer material.

The acoustic impedance of a piezoelectric material may be reduced in conjunction with potentially enhancing the electromechanical efficiency of the piezoelectric material by creating a composite of the piezoelectric material and another generally lower acoustic impedance material that acts as a filler and forms a supportive matrix surrounding the piezoelectric material by one of many means. However, it is understood that there are trade-offs between acoustic efficiency, electrical impedance, and acoustic impedance when making piezoelectric composites.

Composites commonly used in ultrasonic transducers are generally of the 1 3 or 2 2 configuration, wherein the first number indicates the number of directions the piezoelectric material is continuous throughout the structure, while the second number indicates the number of directions that the filler material is continuous throughout the structure. Some examples of methods of creating composite piezoelectric materials include dicing, etching, molding, or random packing of piezoelectric materials, and filling or bonding other materials such as elastomers, epoxies, polymers, or gases interspersed between the piezoelectric pillars or beams to form the composite.

An example of a composite material in the 1 3 configuration includes a diced and filled composite having square cross section pillars and kerfs filled with a material having a lower acoustic impedance. Such composites can utilize a bar mode resonance in the piezoelectric pillars making possible a more efficient electromechanical coupling coefficient bounded by the $k_{33}$ property of the piezoelectric rather (typically ~0.7 for PZT) than the less efficient $k_t$ (typically 0.5 for PZT) bounding the performance of plate mode vibrations more typical of simple longitudinal disc or plate-based transducers. It is to be noted that the acoustic impedance of the composite can be reduced in comparison to the pure piezoelectric material falling somewhere between the piezoelectric material and the matrix filler, based on a number of design parameters of the composite geometry, and material properties of both the piezoelectric and the filler material. Thus, making matching of lower acoustic impedance materials less difficult and achieving higher signal to noise ratios.

Much work in the art of composite transducer development has occurred in the biomedical field and has focused on developing efficient composites designed to be compatible with biological tissues. As such, many commercially available composite materials and transducers have been optimized to have a combination of the lowest acoustic impedance possible while achieving the highest electromechanical efficiency possible for applications to biological tissue and/ or water immersion applications. Such composite materials typically have acoustic impedance in the range of 8 MR to 16 MR. However, many practical applications require the efficient transmission of acoustic energy from and to an ultrasonic transducer coupled to materials having an acoustic impedance that is not well matched to these piezoelectric materials. That is, the piezoelectric materials described above may not be suitable for other classes of material being insonated. For instance, materials having an acoustic impedance of between about 15 MR and 30 MR are particularly difficult to match with piezocomposites due to a scarcity of ideal materials for traditional acoustic stack design.

In these cases, various techniques to overcome the inherent acoustic discontinuity between the piezoelectric material and the medium are known. For example, a common method of matching the acoustic impedance of a piezoelectric material to the desired medium is the use of ¼ wave matching layers. Another example is to use a spring mass matching layer system that is applied at high frequencies. Still a further example is the design of horn structures. Such acoustic impedance matching technologies may be applied to piezoelectric transducers designs to facilitate efficient transmission of acoustic radiation from the transducer to the medium being insonated and typically operate in reciprocal manner. However, one thing remains common to all acoustic impedance matching approaches, that is they have a finite bandwidth over which they are effective. Outside this bandwidth, their effectiveness falls off quickly, and can give rise to unwanted artifacts when operated far enough away from the intended center frequency.

While acoustic impedance matching in transducer design is important, in many real-world applications it is also necessary to electrically insulate the piezoelectric transducer assembly from the material being insonated. In these scenarios an electrically insulating layer must also be included in the transducer stack. For example, in fields such as non-destructive testing (NDT) it is sometimes necessary to electrically insulate the ultrasonic transducer from electrically sensitive assemblies, devices, or structures while also matching the acoustic impedance of the transducer with the material or object being scanned. This is especially important in medical applications. Indeed, electrically insulating the transducer assembly from a human body (the medium being insonated) is important to help prevent injury to the patient. For example, in the case of medical diagnostic ultrasound (and other medical ultrasound applications that include but are not limited to therapeutic applications such as HIFU) for reasons of efficiency the transducer's acoustic impedance should be matched to living tissue while also being electrically isolated from the patient. In other medical devices using acoustic energy for acoustic ablation or mechanical enhancement of surgical tools for example, it is also desirable for efficiency reasons to match the acoustic impedance of the transducer with the medium (either biological tissue, or in some cases components of acoustic medical devices) while electrically isolating the transducer from the patient.

In many cases, when the target material has an acoustic impedance below about 10 MR, there is a well-developed body of technology readily available to the designer to cope with the need to both acoustically match the transducer to the target while simultaneously isolating it electrically.

A typical solution applied in medical diagnostic ultrasound for patient contacting ultrasonic transducers is to choose a lens or cover material that is well matched to the living tissue, such as silicone or poly urethane for example, both of which can be engineered to have acoustic impedance closely matching that of tissue (about 1.5 MR) while still acting as effective lenses and electrical insulating materials. Another common practice is to use electrically insulating matching layers that are acoustically matched. These matching materials include various glasses, polymers, elastomers, powered loaded polymers and epoxies. For example, ceramic powder loaded epoxies, such as for example, alumina powder filled epoxy that can form various matching layers while retaining excellent resistivity required for electrical isolation. However, powder loaded composites such as powered loaded epoxies, silicones and polymers typically exhibit higher attenuation than homogeneous materials and may not offer a suitable compromise between matching layer design parameters (such as thickness) and acceptable losses in the acoustic path of the device and required electrical isolation.

In addition, the manufacture of powder loaded composite materials reach limitations when high-volume fractions of powder to polymer are reached. For example, the common practice of powder loading epoxy to raise acoustic impedance is impractical above approximately 12 MR. Additionally, epoxy filled porous sintered materials are costly to design and difficult to control accurately. They can also be lossy if not perfectly filled. This is especially true for electrically insulating matching layers over 15 MR and below 30 MR.

It is to be noted that the use of matching layers in ultrasonic transducer designs is problematic when a broadband transducer is required, because multiple matching layer solutions are required for broad band performance. It is difficult to design a broadband ultrasonic transducer for coupling in the 10 MR to 30 MR target. These challenges are further compounded when there is a requirement to electrically insulate the transducer from the target material.

It is increasingly difficult to apply existing solutions with a high degree of effectiveness when the target material has an acoustic impedance ranging from about 15 MR to about 30 MR. This is because there are relatively few electrically insulating materials that can be used as traditional matching layers that satisfy the acoustic, thermal and electrical properties for target materials having an acoustic impedance in the range of about 15 MR to about 30 MR.

There is a need for ultrasonic transducers capable of transmitting high power, broadband acoustic pulses into materials having acoustic impedance in the range of about 15 MR to about 30 MR in fields such as, for example and without being limitative, NDT and medical device development. There is also a need for an electrically insulating layer having a substantially similar (or near-identical) acoustic impedance to the target material and the piezoelectric layer. Currently, piezoelectric composite design and existing solutions do not allow for changing the acoustic impedance of the piezocomposite without also impacting its electrical impedance (and vice-versa).

What has been found is that the electrical impedance and the acoustic impedance can be independently manipulated (i.e., at least partially decoupled) by incorporating high acoustic impedance non-piezoelectric material in the piezocomposite material design in addition to the traditional materials used to make piezocomposites, which is in contrast with the typical approach generally incorporating low acoustic impedance kerf filler materials used as in traditional piezocomposite design.

Ultrasonic Transducer

Figure 2:
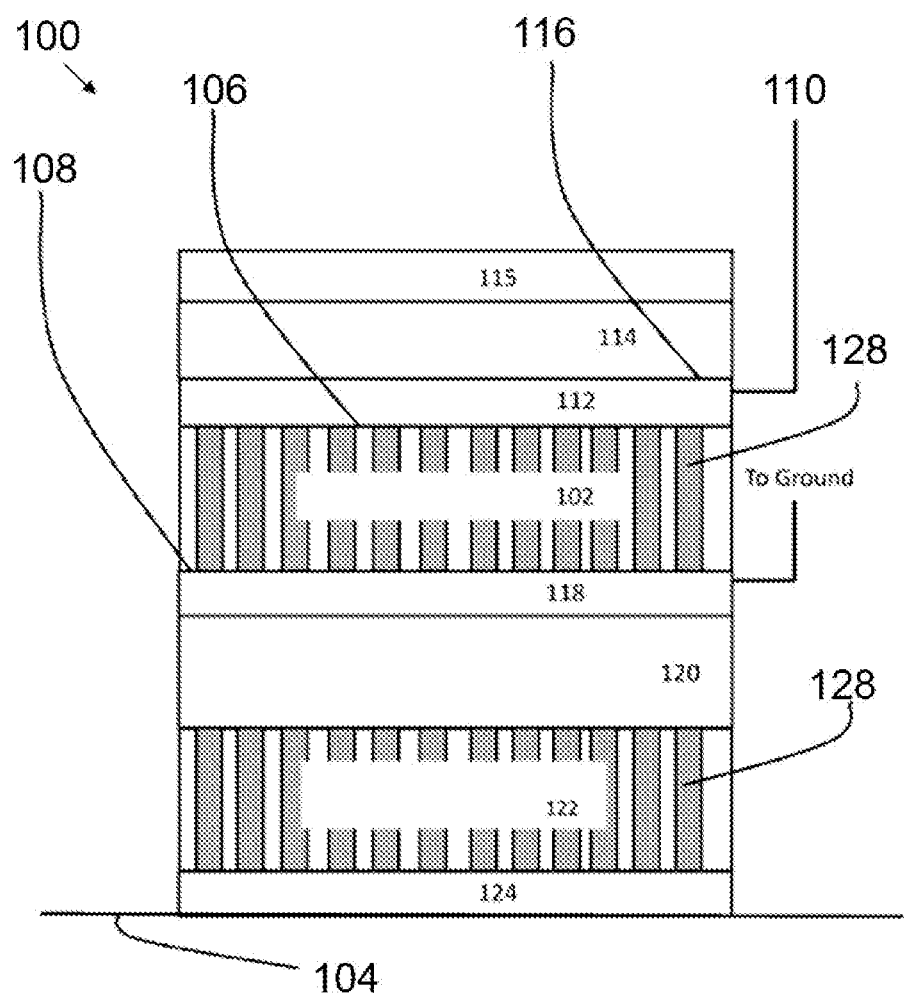
FIG. 2 illustrates a cross-sectional view of an ultrasonic transducer, in accordance with another embodiment.

Now turning to the Figures, different embodiments of an ultrasonic transducer will now be described. FIGS. 1 and 2 illustrate two embodiments of an ultrasonic transducer 100 including a piezoelectric composite layer 102.

Figure 3:
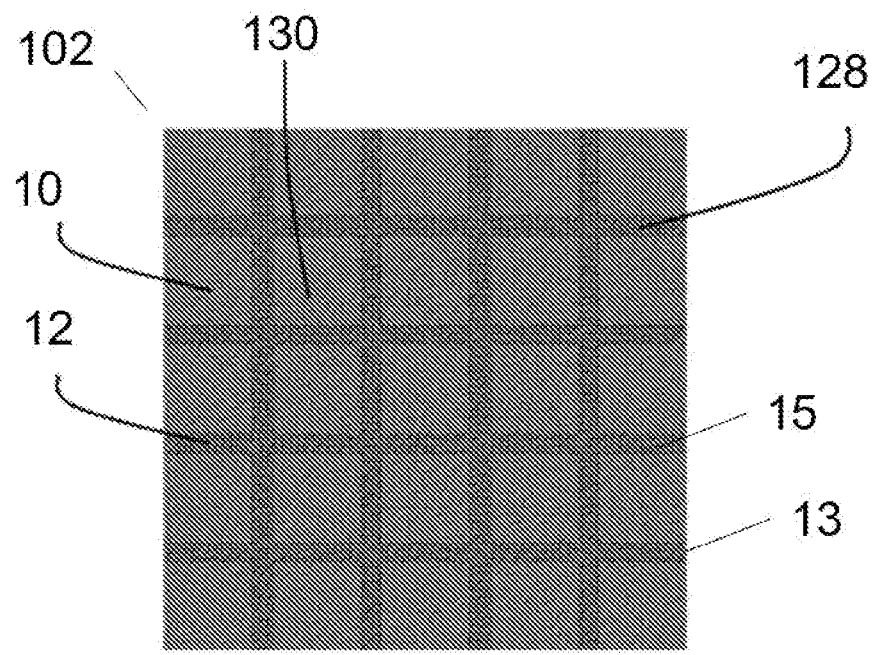
FIG. 3 shows a top view of a piezoelectric composite layer for an ultrasonic transducer, in accordance with one embodiment.
Figure 4:
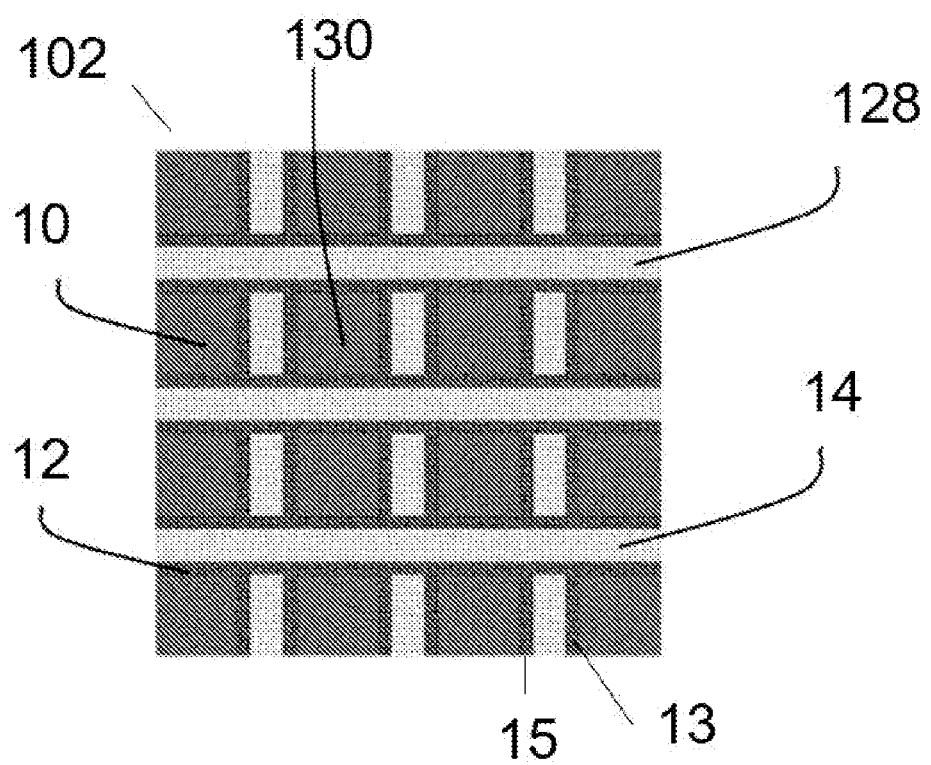
FIG. 4 shows a top view of a piezoelectric composite layer for an ultrasonic transducer, in accordance with another embodiment.
Figure 5A:
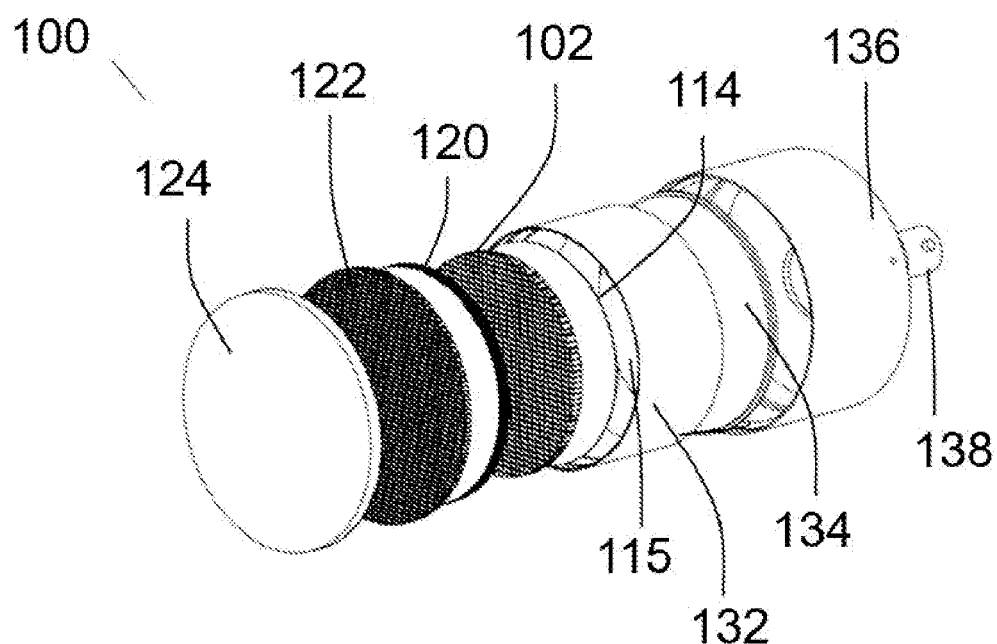
FIG. 5A depicts a perspective view of an ultrasonic transducer, in accordance with one embodiment.
Figure 5B:
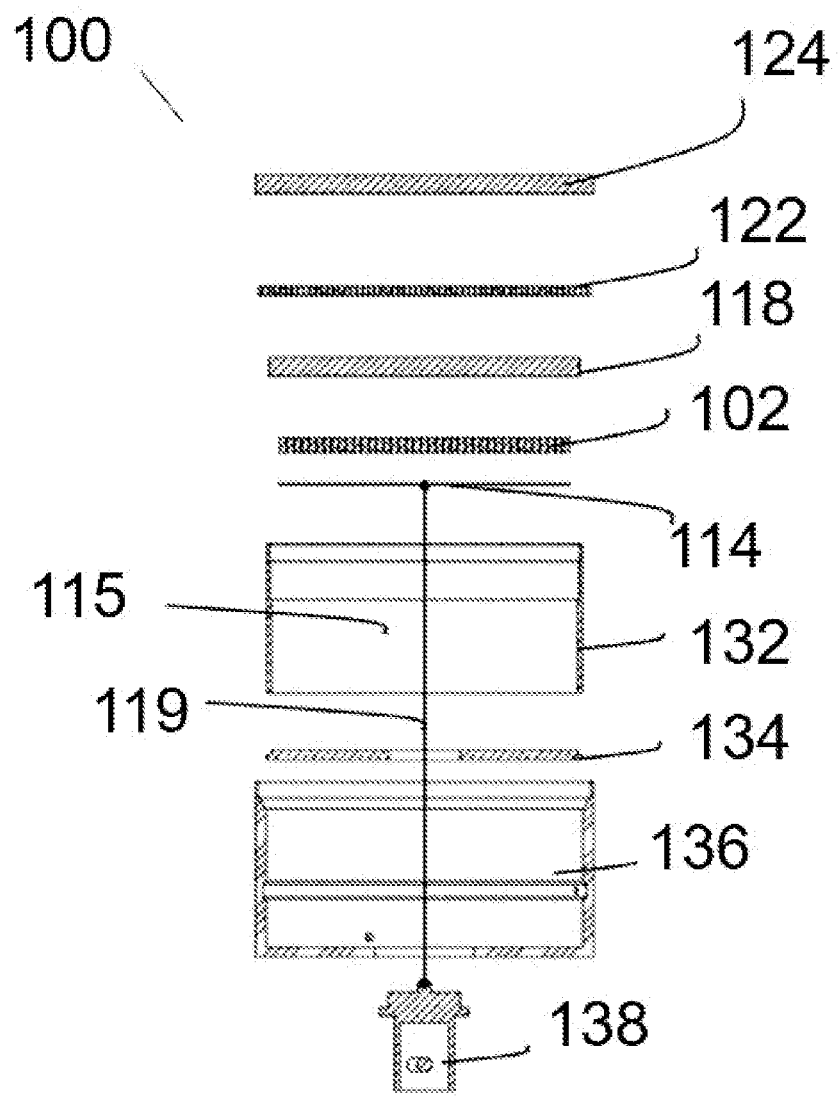
FIG. 5B depicts an exploded cross-sectional view of the ultrasonic transducer of FIG. 5A.

The piezoelectric composite layer 102 is configured to be in acoustic communication with a sample or a target material. The piezoelectric composite layer 102 has at least partially decoupled acoustic impedance and electrical impedance properties, i.e., that the combination of materials included in the piezoelectric layer 102 allows the partial decoupling of the electrical impedance from the acoustic impedance. The piezoelectric composite layer 102 is typically made from at least three materials. As illustrated in FIGS. 3 and 4, the piezoelectric layer 102 includes an array of spaced-apart piezoelectric regions 10, a filler material 12 and a non-piezoelectric material 15. Each spaced-apart piezoelectric region 10 is made from a piezoelectric material having a first acoustic impedance and a first electrical relative permittivity. The filler material 12 is positioned between adjacent spaced-apart piezoelectric regions 10 and includes a polymer matrix 13 having a second acoustic impedance and a second electrical permittivity. The second acoustic impedance is smaller than the first acoustic impedance and the second relative permittivity is smaller than the first relative permittivity. The non-piezoelectric material 15 is in contact with the polymer matrix and have a third acoustic impedance and a third relative permittivity. The third acoustic impedance is greater than the second acoustic impedance, and the third relative permittivity is smaller than the first relative permittivity. In some embodiments, the non-piezoelectric material 15 is embedded within the polymer matrix. Referring back to FIGS. 1 and 2, the ultrasonic transducer 100 includes one or more electrodes 112 in electrical communication with the piezoelectric composite layer 102.

Referring now to FIGS. 1 and 2, a cross-sectional view of an embodiment of the ultrasonic transducer 100 is provided. As illustrated, the ultrasound transducer 100 has an acoustic stack design (i.e., a plurality of layers) that includes a diced-and-filled piezo-composite element/layer 102 that is acoustically matched to the target material 104. In some embodiments that will be described in greater detail below, the ultrasound transducer 100 can electrically insulated from the target material 104. The piezo-composite element 102 has a proximal surface 106 and a distal surface 108 relative to the ultrasound signal source 110. The acoustic path extends between the piezoelectric composite layer 102 though the target material 104.

In some embodiments, such as the ones depicted in FIGS. 3 and 4, the piezoelectric composite layer 102 can be made from a ferroelectric piezoelectric material such as, for example and without being limitative, PZT. In the illustrated variant, the piezoelectric regions 10 form pillars or beams 130 and are spaced from one another in the manner typical of 1 3 or 2 2 composites, meaning that the piezoelectric material 10 is continuous along one direction and the filler material 12 is continuous along three directions or that the piezoelectric material 10 is continuous along two directions and the filler material 12 is continuous along two directions.

This embodiment notably enables increasing the electrical impedance of the piezoelectric composite, while maintaining the desired acoustic impedance. In FIG. 4, the spaces provided between adjacent piezoelectric regions 10 are kerfs 128. The kerfs 128 are filled with epoxy 12. In some embodiments, the epoxy 12 include HFO powder filled matrix material.

It is to be noted that while the piezoelectric regions 10 are shown as being square, they can be of any shapes, such as, for example and without being limitative, triangular, cylindrical, or hexagonal.

In some embodiments, it may be desirable to reduce the piezoelectric material volume fraction (e.g., the PZT fraction) in the piezoelectric composite layer 102 to achieve better, improved or more ideal electrical impedance requirements of the transducer. However, the acoustic impedance requirement of the ultrasonic transducer 10 may be required to be higher this suggesting a higher volume fraction of PZT would be desirable. In such embodiments, using HFO powder filled matrix material is not enough to achieve the required characteristics. In these scenarios, which are for example depicted in FIG. 4, the HFO powder filled matrix material may be replaced or partially replaced with a non-piezoelectric material, such as, for example and without being limitative, alumina bars. Such materials a allow for a higher acoustic impedance in the piezoelectric composite layer 102, while reducing the effective relative permittivity. In another embodiment, other relatively high acoustic impedance materials may be used In some embodiments, the kerfs 128 are filled with bars of alumina 14. Alumina typically has acoustic impedance of about 35 MR and a dielectric constant of about 10. In the illustrated embodiment of FIG. 4, the bars are sized to fill approximately 70% of the width of the kerfs 128, leaving the remaining 30% to be filled with kerf filling epoxy 12. It will be appreciated that different fill material and different epoxy materials, as well as other ratios, can be used to achieve desired acoustic and/or electrical impedance properties, which notably depend on the target material being insonated.

It is to be noted that the non-piezoelectric material 15 is not necessarily limited to alumina bar. For example, and without being limitative, the alumina bars may be replaced by alumina spheres mixed into the HFO epoxy or cuts from a composite material made from the HFO epoxy containing the alumina spheres. It is also to be noted that similar results can be achieved by adjusting the ratio (i.e., volume fraction) of kerfs, filler, and epoxy, thus enabling to independently adjust the electrical and acoustic impedance of the piezoelectric composite layer 102, in order to match the desired acoustic and/or electrical properties (e.g., of a target material). It will be appreciated that the ratios of the materials forming the piezoelectric composite layer 102 can vary greatly depending on the results desired. The result of this design is a composite piezoelectric that can be designed, adjusted and tailored to have a wider range of electrical impedance for a given size while maintaining a desired acoustic impedance. The added third material, namely the non-piezoelectric material 15 preferably has a high acoustic impedance, i.e., an acoustic impedance similar or comparable to the piezoelectric material (if possible) and a much lower relative permittivity than the piezoelectric material. As such, the piezoelectric composite layer 102 can be designed or adjusted to have a desired acoustic impedance and a desired permittivity making both acoustic impedance matching techniques and electrical impedance matching circuits unnecessary.

As it has been previously mentioned, the ultrasonic transducer 100 includes one or more electrodes, for example a signal electrode 112, as depicted in FIGS. 1 and 2. In some embodiments the piezoelectric composite layer 102 is configured to generate a probing acoustic signal towards the sample 104 and the electrodes (e.g., the signal electrode 112) are operable to send a probing electrical signal to the piezoelectric composite layer 102, thereby generating the probing acoustic signal. In some embodiments, the piezoelectric composite layer 102 is further configured to receive a sample acoustic signal emanating from the sample 104, thereby generating a sample electrical signal towards the one or more electrodes (e.g., the signal electrode 112), the sample electrical signal being representative of the sample acoustic signal. As such, the ultrasonic transducer 100 can be used to transmit and/or receive ultrasound.

In some embodiments, such as the ones depicted in FIGS. 1 and 2, the electrodes 112 are located on a proximal surface 106 of the piezoelectric composite layer 102. The electrode 112 can have an electrically conducting backing layer 114 located on a proximal surface 116 of the signal electrode 112. In still other embodiments, the backing layer can be electrically insulating. The backing layer 114 can be operatively or electrically connected to the signal electrode 112. In one embodiment, the backing layer 114 is made of titanium and can have a thickness of about 200 microns. The backing layer 114 can be made from a sufficiently high acoustic impedance material to also act as a de-matching layer. Such de-matching capabilities generally require that the backing layer has an acoustic impedance of at least two times the acoustic impedance of the piezoelectric material, thereby providing enhanced bandwidth and sensitivity. For example, the de-matching layer 114 may be made from, for example and without being limitative, molybdenum, tungsten, or tungsten carbide.

In some embodiments the piezoelectric material is selected from the group consisting of ferroelectric materials, single crystal ferroelectric materials, lead free ferroelectric materials and piezoelectric polymeric materials. For example, and as it has been previously mentioned, the piezoelectric material can be lead zirconate titanate (PZT).

In some embodiments, the polymer matrix is made from epoxy and the non-piezoelectric material is hafnium oxide powder.

The ultrasonic transducer 100 can also be provided with one or more electrically insulating regions positioned between adjacent spaced-apart piezoelectric regions 10, the one or more electrically insulating regions being in contact with the filler material 12. The electrically insulating regions have a fourth acoustic impedance and a fourth relative permittivity. In some embodiments, the fourth acoustic impedance being close to the first acoustic impedance, and the fourth relative permittivity being smaller than the first relative permittivity. For example, and without being limitative, the electrically insulating regions can be made from ceramic or glass. The shape of the electrically insulating regions can vary. They can have, for example and without being limitative, an elongated shape, define bar-shaped electrically insulating regions, define or can be spherical.

Now turning to the materials used in the ultrasonic transducer, it will be understood that the use of a differing volume fractions of filler powder and/or different filler powders in the matrix material will allow for fillers of different acoustic impedances. For example, one skilled in the art will understand that by mixing epotek 301 epoxy and HFO powder in varying volume fractions, one can practically realize a powder loaded epoxy material having an acoustic impedance between approximately 3 and about 10 MR. In one embodiment, the filler material 12 is designed to have an acoustic impedance of about 7 to about 8 MR. It will also be appreciated that the piezoelectric composite layer 102 will exhibit different characteristics than a non-composite piezoelectric. For example, a non-composite piezoelectric can have a relatively high Q factor, making it inherently a relatively low bandwidth material. In this embodiment, however, using a lower impedance matrix material to form the 1 3 PZT piezoelectric composite provides an improved bandwidth and efficiency when compared to a simple PZT plate-based element. In addition, the 1 3 composite PZT also exhibits a lower dielectric constant comparted to the pure PZT allowing for a more practical electrical impedance from a large single element design. It will be appreciated that other piezoelectric materials could be used in other embodiments without departing from the scope of the current description. Such piezoelectric materials include, but are not limited to, lithium niobate, various PZT-based material (e.g., PZT 8 or PZT 5H), ferroelectric relaxor-based ceramics and relaxor-based single crystals (e.g., PMN-PT), quartz, and other piezoelectric materials that have suitable properties for the desired application such as higher bandwidth, higher sensitivity, or lower cost. As such, using relatively high acoustic impedance powder loaded kerf fillers between piezoelectric pillars allows for a more adequate trade-off between the acoustic impedance, electrical impedance, and pillar aspect ratios with enhanced freedom when compared to existing piezo-composites that are typically constructed using fillers ranging from 1 MR to 3 MR, for example and without being limitative when one wished to match the piezocomposite transducer to materials having relatively higher acoustic impedance such as for example, titanium, or zirconium. In some scenarios, higher acoustic impedance kerf fillers may result in reduced acoustic isolation between pillars, thus reducing the electromechanical coupling coefficient of the composite. However, the proposed trade-off may be deemed acceptable in light of the improved acoustic match and bandwidth of the resulting acoustic path from the composite to the target material or DUT. Using the HFO powder filled matrix material, a relatively low volume fraction of a piezoelectric material (e.g., 73% PZT vol/vol) can be used to achieve a 27.4 MR average acoustic impedance. As a comparison, existing piezocomposites require about 78% for a typical 3 MR unfilled epoxy. The lower volume fraction of the piezoelectric material in the piezoelectric composite layer 102 allows for a higher electrical impedance to be achieved without sacrificing the acoustic match. In addition, the 73% volume fraction makes dicing more efficient allowing for the use of larger blades, thereby facilitating the manufacturing process, as well as enhancing the designer's freedom to optimize the pillar aspect ratio to achieve optimal bar mode resonance. Another benefit of using a powder loaded matrix in the composite is the ability to alter the powder loaded epoxy matrix to fine tune the acoustic impedance of the piezoelectric composite without requiring changes to the pillar dimensions and dicing. Such changes in the design of the pillars and pillar dimensions and related dicing are known to be costly.

Now turning to the acoustic impedance of the ultrasonic transducer 100, in some embodiments, the acoustic impedance property of the piezoelectric composite layer 102 ranges from about 15 MR to about 30 MR. As it has been previously established, this impedance property is a combination of the impedance of each material forming the piezoelectric composite layer 102. In this regard, in some embodiments, the first acoustic impedance ranges from about 30 MR to about 40 MR and the third acoustic impedance ranges from about 7 MR to about 8 MR. It is to be noted that the piezoelectric composite layer is acoustically matched with the sample and can be, in some embodiments, electrically insulated from the sample by the inclusion of an electrically insulating non-piezoelectric composite layer 122.

In some embodiments, the ultrasonic transducer 100 further includes a backing layer 114 in electrical communication with the one or more electrodes 112. The backing layer can in some scenarios acts as a de-matching layer.

The ultrasonic transducer can include a ground electrode 118, as illustrated in FIGS. 1 and 2. The ground electrode 118 is located on a distal surface 108 of the piezocomposite element 102. In some embodiments, the ground electrode 118 may also act as a heat spreader to spread heat generated by the ultrasound transducer 100. It is to be noted that the ground electrode 118 does not necessarily act as a heat spreader.

The piezoelectric composite layer 102 and the sample or target material 104 define an acoustic path therebetween. In some embodiments, the ultrasonic transducer 100 further includes a near lossless acoustically matched layer 120 positioned along the acoustic path, between the piezoelectric composite layer 102 and the sample 104. The near-lossless acoustically matched layer 120 is positioned adjacent to and in contact with the distal surface of the ground electrode 118. The near-lossless acoustically matched layer 120 is electrically conductive and has a substantially low thermal-impedance. When the ultrasonic transducer is used to insonate titanium, the acoustically matched layer 120 can be made of be titanium. It is to be noted that the acoustically matched layer 120 is optional and can act, in some embodiments, as a thermal heat spreader, as well as a mechanical support layer. The mechanical support reinforces the ground layer and can be also beneficial during the fabrication of the ultrasonic transducer 100. It is generally not possible to have the acoustically matched layer 120 but for the fact that all the layers in the ultrasound transducer 100 are acoustically matched. The acoustically matched layer 120 is an effective heat spreader that could not ordinarily be included in an acoustic design right next to the piezoelectric element 102. Typically, it is expected that the material for the acoustically matched layer is the same as the material of the DUT. That is, the same material that the transducer 100 was designed to match to. It is possible to select another well-matched material however, with desirable properties, for example and without being limitative, when the DUT is titanium, choosing the acoustically matched layer 120 material to be zinc, having a relatively better thermal conductivity than titanium but nearly equivalent acoustic impedance as titanium. This is possible in an acoustically matched stack with minimal design challenges, as the thickness of the layers and properties other than acoustic impedance can easily be accommodated in the design.

In some embodiments, the ultrasonic transducer 100 further includes a wear layer 124. The wear layer 124 is acoustically matched with the piezoelectric composite layer 102. The wear layer 124 can be acoustically matched with the other layers of the ultrasonic transducer 100. In some embodiments, the wear layer 124 is in acoustic contact with the distal surface of the electrically insulating ceramic-composite layer 122. The wear layer 124 could be the same material as the DUT, especially if that material is near lossless as with many metals. For example, in one embodiment designed to insonate titanium, the wear layer 124 is made from a 3 mm thick layer of titanium. In this embodiment, the wear layer 124 is configured to be electrically insulated from the transducer signal and ground, allowing the transducer assembly to be electrically isolated from the DUT.

In some embodiments, robust thermal and mechanical ground structure are provided to support and facilitate the cooling of the piezoelectric composite layer 102. In one nonlimitative embodiment, the piezoelectric composite layer 102 is adhered to a disk of titanium of 3 mm thickness, thus establishing a thermal cooling path to the electrical ground conductors and establishing a grounding electrode. The base also can also act as a mechanical support that aids in the manufacturing of the piezoelectric composite and stack. In some embodiments, the conductive disk can be chosen to match the target materials and/or acoustic impedance or the target materials for a broad range of applications of the ultrasonic transducer 100 covering the range of acoustic impedance from about 10 MR to over 30 MR. In some scenarios, when the target material 104 is electrically conductive, for example, when the target material is a metal, the disk can, in fact, be the same material as the target material. A low loss wear plate can then be bonded to the distal face of the electrically insulating layer to provide additional mechanical support for the insulating layer, as well as superior moisture resistance. Generally, the wear plate can be made from the target material itself, and in the case of the exemplary embodiment is chosen to be 3 mm thick titanium.

In some embodiments, the piezoelectric composite layer 102 has a thickness of approximately 2400 microns. It is to be noted that the ultrasonic transducers of prior art normally have constraints on the thickness of every layer being provided. Because the ultrasonic transducer 100 has all layers with the same acoustic impedance, there is no limitation or reduced limitations on the thickness of the layers. The layers can be thicker or thinner as required by the application. In an embodiment, the acoustically matched layer 120 is thicker to provide enough mass to function as a heatsink. Therefore, the layers of the transducer distal to the piezoelectric layer 102 may be of arbitrary thickness providing the acoustic impedance of the layers distal of the piezoelectric layer are matched or nearly matched. Such configurations enable the possibility to optimize other properties of the distal layers independent of the thickness of the layer. In one example, the matched layer 120 may be thickened to achieve mechanical robustness with less concerns about acoustic performance or thinned to reduce cost without impacting the acoustic performance. Also, the layers of the ultrasonic transducer 100 adjacent and on the proximal side of the piezoelectric layer 102 should be of appropriate thickness and material to enhance the output efficiency of the transducer 100.

In some embodiments, each spaced-apart piezoelectric region 10 is spaced by 200 microns one from another and has a square cross-section, the square cross-section being 1000 microns by 1000 microns. The piezoelectric composite layer 102 can have different piezoelectric volume fraction, depending on the target material 104. In some embodiments, the piezoelectric composite layer 102 has a piezoelectric volume fraction ranging from about 70% to about 80%.

The ultrasonic transducer 100 or components thereof can be housed in an electrically insulating housing.

A RF electrical connector 138 can also be provided. The RF electrical connector 138 is operatively connected, via an electrical connection (e.g., wire) to the electrode 112. This provides an electrical connection to the ultrasound signal source 110.

In some embodiments, a copper (Cu) ground return and a thermal return 132 is also provided. The Cu ground return and thermal return 132 provides a housing to house, at least in part, a Cu lid 132, the backing layer and/or de-matching layer 114, the electrode 112, the piezoelectric composite layer 102, and the ground 118. It will be appreciated that the Cu ground and thermal return 132 can be of any appropriate shape for housing the aforementioned items. In the illustrated embodiments depicted in the Figures, the Cu ground return and thermal return 132 is annular in shape. The Cu lid 134 copper is useful for conducting heat and/or electricity. In some embodiments, the Cu lid 134, the Cu ground return and thermal return 132, the dematching/backing layer 114, the electrode 112, the PZT composite 102, and the ground 118 can be press fit together to form a single unit. The ground 118 can optionally include a knurled edge to ensure a good thermal and electrical contact to the Cu ground return and thermal return 132.

As it has been previously mentioned, the techniques, devices, apparatuses and methods described in the current description can be implemented to generate and transmit ultrasound ("transmission mode"), detect and receive ultrasounds ("detection mode"), or both. In some implementations, the ultrasonic transducer according to the present disclosure could also be used for delivering acoustic energy for other purposes, such as, for example and without being limitative, transducers designed to drive medical shockwave therapy systems. In these implementations, the ultrasonic transducer 100 is configured to emit an acoustic signal towards a target. In these embodiments, the ultrasonic transducer also includes a piezoelectric composite layer 102 having at least partially decoupled acoustic impedance and electrical impedance properties. The piezoelectric composite layer 102 includes an array of spaced-apart piezoelectric regions 10, a filler material and a non-piezoelectric material 15. Each spaced-apart piezoelectric region 10 is made from a piezoelectric material having a first acoustic impedance and a first electrical relative permittivity. The filler material 12 is positioned between adjacent spaced-apart piezoelectric regions 10 and includes a polymer matrix 13 having a second acoustic impedance and a second electrical permittivity. The non-piezoelectric material 15 is in contact with the polymer matrix 13 and has a third acoustic impedance and a third relative permittivity. The second acoustic impedance is smaller than the first acoustic impedance (of the piezoelectric material), and the second relative permittivity is smaller than the first relative permittivity, and the third acoustic impedance being greater than the second acoustic impedance, and the third relative permittivity being smaller than the first relative permittivity. The ultrasonic transducer according to this implementation further includes one or more electrodes 112 in electrical communication with the piezoelectric composite layer 102. The electrodes 112 are operable to send an electrical signal to the piezoelectric composite layer 102, thereby generating the acoustic signal towards the target.

As it has been previously mentioned, it can sometimes be useful for an ultrasonic transducer 100 to be electrically insulated from the material being insonated, for example and without being limitative, in the context of medical applications or when the insonated material could be easily damaged by electricity. Such implementations of the ultrasonic transducers 100 can be similar to the embodiments which have been previously described and includes the piezoelectric composite layer 102 configured to be in acoustic communication with the sample 104 and having at least partially decoupled acoustic impedance and electrical impedance properties. The piezoelectric composite layer 102 according to this implementation includes an array of spaced-apart piezoelectric regions 10, wherein each spaced-apart piezoelectric region 10 is made from a piezoelectric material, a filler material 12 positioned between adjacent spaced-apart piezoelectric regions 10, wherein the filler material 12 includes a polymer matrix 13 and a non-piezoelectric material 15 in contact with the polymer matrix 13. As exemplified in FIGS. 1 and 2, the ultrasonic transducer 100 according to this implementation further includes an electrically insulating ceramic composite layer 122 extending over or in contact with the piezoelectric composite layer 102 for electrically insulating the piezoelectric composite layer 102 from the sample 104. The electrically insulating ceramic composite layer 122 is acoustically matched to the piezoelectric composite layer 102 and the sample 104. In these implementations, the electrodes 112 are in electrical communication with the piezoelectric composite layer 102.

In some embodiments, the electrically insulating ceramic composite layer 122 is acoustically matched and is a diced-and-filled electrically insulating ceramic-composite layer 122. The ceramic-composite layer 122 can be located on and/or be in mechanical contact with the distal surface of the lossless acoustic layer 120 which has been described above. It is to be noted that the insulating layer 122 is generally not lossless and the thickness is a compromise between electrical isolation and acceptable acoustic loss. In one nonlimitative embodiment, the thickness of the electrically insulating layer 122 is 1.4 mm and has a pitch of 950 um with 750 um pillars and kerfs of 200 um. The kerf filling material for the electrically insulating layer 122 may be the HFO epoxy. In another nonlimitative embodiment, electrically insulting layer 122 include a base ceramic made from alumina. In yet another non limitative embodiment, the base ceramic can be any other ceramic having an acoustic impedance over about 30 MR. One will appreciate that in the context of this embodiment, the general problem to be solved by is that there are a lack of electrically insulating materials having an acoustic impedance of about 15 MR to 30 MR. Using an electrically insulating layer 122 addressed this general problem because the degree of isolation and the acceptable acoustic loss are the only considerations as to the thickness of the layer. It is to be noted that no significant impact to the devices bandwidth or frequency response is incurred with thickness changes to the electrically insulating layer 122. In some embodiments, the ultrasonic transducer 100 includes an electrically insulating housing 136 for containing the ultrasound transducer.

In some embodiments the ultrasound transducer 100 further includes an acoustically matched insulating layer 122 located adjacent to and in contact with the distal face of the ground electrode layer 118. The layer 122 can be made of a solid insulating material or a composite and should exhibit both the desired acoustic impedance and acceptable acoustic losses, as well as having sufficient dielectric strength and permittivity to achieve the required electrical isolation for the device. In one embodiment, the insulating layer is comprised of a 1 3 composite layer of alumina and HFO filled epoxy to achieve an acoustic impedance of about 27 MR, making it an acoustic match for titanium. It is to be understood that this matched insulating layer 122 is not a matching layer but is itself tailored in a similar manner to the piezoelectric composite layer so that it has effectively the same acoustic impedance as the target material. The matched insulating layer 122 is inherently broad band and having a flat frequency transmission coefficient below an upper cut-off frequency determined by the pillar size and pitch as is the usual case with acoustic composites. The thickness of the electrically insulating layer is not frequency dependent and is only a design factor as it relates to managing acceptable attenuation versus acceptable electrical leakage currents.

Example of Implementations

Different possible implementations of the ultrasonic transducer will now be described.

In one implementation, the ultrasound transducer 100 is a single element transducer. The single element transducer can have the following characteristics: a single element acoustic aperture of 50 mm, 50 Ohms magnitude electrical impedance at the centre frequency, a broad-band frequency response (one way—6 dB fractional bandwidth of about 100%), a centre frequency of about 0.6 MHz, and an acoustic impedance matched to titanium (about 27.4 MR+/- about 0.5 MR). In addition to these characteristics, this implementation exhibits high-power handling capability and thermal dissipation characteristics due to the inclusion of a relatively thick thermally conductive layer bolstering the effectiveness of the ground electrode both electrically but primarily thermally. For example, if the DUT is metallic, titanium for example, this layer could be made of the same material as the DUT material. This inclusion is possible due to the entire portion of acoustic stack adjacent to the distal side of the piezoelectric element and including the piezocomposite element having the same acoustic impedance as the DUT material. In this implementation, the piezoelectric composite layer 102 can be a 1 3 composite of PZT and the filler material 12 can be made of HFO powder loaded epoxy designed to have an acoustic impedance very close to about 27.4 MR, resulting in an acoustic match with the titanium. It is to be understood that this is comparatively lower than the acoustic impedance of a non-composite PZT, which is approximately 34.5 MR, and much higher than a typical polymer filled piezocomposite of PZT being typically between 8 MR and 16 MR. In this implementation, PZT is selected for its blend of efficiency and thermal robustness. The HFO powder loaded epoxy is chosen as matrix material used to fill the kerfs in the PZT plate to create the composite. The HFO powder loaded epoxy has relatively high acoustic impedance of approximately 7 MR to about 8 MR to enable the resulting 1 3 composite to have an acoustic impedance closely matching that of titanium. In this implementation, the piezoelectric composite layer 102 has 1000 um by 1000 um pillars of PZT (having a square cross section) occurring on a pitch of 1200 microns, and regularly separated by kerfs of 200 microns. The composite piezoelectric element/layer 102 has a thickness of 2400 um.

In another implementation, there is provided an electrically isolated transducer having a wideband and a low loss coupling mechanism to the intended acoustic load medium, which can be optimized for centre frequency and frequency response almost exclusively by optimization of the piezoelectric composite layer and the design of the backing and/or de-matching layer. No matching on the distal side of the piezoelectric composite is necessary, and nearly perfectly flat frequency response of the acoustic stack is achieved at all frequencies which are below the effective cut-off frequency dictated by the pillar sizes and spacing chosen for both the piezocomposite and the ceramic-composite elements. This implementation allows for the ultrasonic transducer having one-way fractional bandwidths in excess of 140% to be designed with no need for any distal-face matching layers so long as they are used in conjunction with the designated target medium. Many different metals and other conductive loads exist that could benefit from an ultrasonic transducer that can be tailored to their respective acoustic impedance, such as, for example and without being limitative, titanium and its alloys, tin, aluminum and many aluminum alloys, zinc, zirconium, lead and other alloys having acoustic impedance in the range of about 15 MR to about 30 MR. In addition, non-metallic materials having acoustic impedance in the above range could also benefit from this implementation to closely match their respective acoustic impedance.

Methods

There is also provided a method for manufacturing the embodiments of the ultrasonic transducer 100 which have been previously described. In one embodiment, the manufactured ultrasonic transducer 100 is designed to operate at a frequency centered at about 600 kHz. The method includes a step of kerf cutting a plate of PZT having a thickness of about 2600 um thick. The kerfs are made from parallel cuts. In one embodiment, this step results in about 1.7 mm center to center 700 um kerfs, leaving about 1 mm of uncut material between the kerfs. The method also includes a step of providing bars of alumina (e.g., having a width of about 400 um) to be inlaid in the kerfs and glued in place with 150 um strips of kerf filling epoxy on both sides of the alumina (e.g., powder loaded epoxy and allowing it to cure). The method also includes a step of cutting the plate at 90 degrees with respect to the to the first set of cuts, thereby defining similar kerfs (having about 1.7 mm center to center spacing and about 700 um kerfs). The subsequently cut kerfs can then be filled with the similar 400 um wide alumina bars and kerf filling powder loaded epoxy. The resulting piezoelectric composite layer has acoustic impedance equivalent to an 82% PZT composite, and can be acoustically matched acoustically to, for example and without being limitative, titanium. The electrical impedance of such composite is however close to that found in a 59% PZT composite.

Several alternative embodiments and examples have been described and illustrated herein. The embodiments described above are intended to be exemplary only. A person skilled in the art would appreciate the features of the individual embodiments, and the possible combinations and variations of the components. A person skilled in the art would further appreciate that any of the embodiments could be provided in any combination with the other embodiments disclosed herein. The present examples and embodiments, therefore, are to be considered in all respects as illustrative and not restrictive. Accordingly, while specific embodiments have been illustrated and described, numerous modifications come to mind without significantly departing from the scope defined in the current description.

The invention claimed is:
1. An ultrasonic transducer, comprising:
  a piezoelectric composite layer having at least partially decoupled acoustic impedance and electrical impedance properties, the piezoelectric composite layer comprising:
    an array of spaced-apart piezoelectric regions defining a layer having a proximal surface and a distal surface, each spaced-apart piezoelectric region being made from a piezoelectric material having a first acoustic impedance and a first electrical relative permittivity, wherein each spaced-apart piezoelectric region is separated one from another by a gap, the gap only extending between the proximal surface and the distal surface of the layer;

a filler material positioned in the gap, between adjacent spaced-apart piezoelectric regions, the filler material comprising a polymer matrix having a second acoustic impedance and a second electrical relative permittivity, the second acoustic impedance being smaller than the first acoustic impedance, and the second electrical relative permittivity being smaller than the first electrical relative permittivity; and a non-piezoelectric material in contact with the polymer matrix, the non-piezoelectric material having a third acoustic impedance and a third electrical relative permittivity, the third acoustic impedance being greater than the second acoustic impedance, and the third electrical relative permittivity being smaller than the first electrical relative permittivity; and one or more electrodes in electrical communication with the piezoelectric composite layer.

2. The ultrasonic transducer of claim 1, wherein:
the piezoelectric composite layer is configured to generate a probing acoustic signal towards a sample and the one or more electrodes are operable to send a probing electrical signal to the piezoelectric composite layer, thereby generating the probing acoustic signal; and
the piezoelectric composite layer is configured to receive a sample acoustic signal emanating from the sample, thereby generating a sample electrical signal towards the one or more electrodes, the sample electrical signal being representative of the sample acoustic signal.

3. The ultrasonic transducer of claim 1, further comprising one or more electrically insulating regions positioned between adjacent spaced-apart piezoelectric regions, the one or more electrically insulating regions being in contact with the filler material, the one or more electrically insulating regions having a fourth acoustic impedance and a fourth electrical relative permittivity, the fourth acoustic impedance being close to the first acoustic impedance, and the fourth electrical relative permittivity being smaller than the first electrical relative permittivity.

4. The ultrasonic transducer of claim 3, wherein the one or more electrically insulating regions are made from a material selected from ceramic or glass.

5. The ultrasonic transducer of claim 1, wherein the non-piezoelectric material is embedded within the polymer matrix.

6. The ultrasonic transducer of claim 1, wherein the piezoelectric material is selected from the group consisting of: ferroelectric materials, single crystal ferroelectric materials, lead free ferroelectric materials and piezoelectric polymeric materials.

7. The ultrasonic transducer of claim 1, wherein the acoustic impedance property ranges from about 15 MR to about 30 MR, the first acoustic impedance ranges from about 30 MR to about 40 MR and the third acoustic impedance ranges from about 7 MR to about 8 MR.

8. The ultrasonic transducer of claim 1, wherein the piezoelectric composite layer and a sample defines an acoustic path therebetween, the ultrasonic transducer further comprising a near lossless acoustically matched layer positioned along the acoustic path, between the piezoelectric composite layer and the sample.

9. An ultrasonic transducer for emitting an acoustic signal towards a target, the ultrasonic transducer comprising:

a piezoelectric composite layer having at least partially decoupled acoustic impedance and electrical impedance properties, the piezoelectric composite layer comprising:

an array of spaced-apart piezoelectric regions defining a layer having a proximal surface and a distal surface, each spaced-apart piezoelectric region being made from a piezoelectric material having a first acoustic impedance and a first electrical relative permittivity, wherein each spaced-apart piezoelectric region is separated one from another by a gap, the gap only extending between the proximal surface and the distal surface of the layer;

a filler material positioned in the gap, between adjacent spaced-apart piezoelectric regions, the filler material comprising a polymer matrix having a second acoustic impedance and a second electrical relative permittivity, the second acoustic impedance being smaller than the first acoustic impedance, and the second electrical relative permittivity being smaller than the first electrical relative permittivity; and a non-piezoelectric material in contact with the polymer matrix, the non-piezoelectric material having a third acoustic impedance and a third electrical relative permittivity, the third acoustic impedance being greater than the second acoustic impedance, and the third electrical relative permittivity being smaller than the first electrical relative permittivity; and one or more electrodes in electrical communication with the piezoelectric composite layer, the one or more electrodes being operable to send an electrical signal to the piezoelectric composite layer, thereby generating the acoustic signal towards the target.

10. The ultrasonic transducer of claim 9, wherein the polymer matrix is made from epoxy.

11. The ultrasonic transducer of claim 9, further comprising one or more electrically insulating regions positioned between adjacent spaced-apart piezoelectric regions, the one or more electrically insulating regions being in contact with the filler material, the one or more electrically insulating regions having a fourth acoustic impedance and a fourth electrical relative permittivity, the fourth acoustic impedance being close to the first acoustic impedance, and the fourth electrical relative permittivity being smaller than the first electrical relative permittivity.

12. The ultrasonic transducer of claim 11, wherein the one or more electrically insulating regions are made from a material selected from ceramic or glass.

13. The ultrasonic transducer of claim 9, wherein the non-piezoelectric material is embedded within the polymer matrix.

14. The ultrasonic transducer of claim 9, wherein the acoustic impedance property ranges from about 15 MR to about 30 MR, the first acoustic impedance ranges from about 30 MR to about 40 MR and the third acoustic impedance ranges from about 7 MR to about 8 MR.

15. An ultrasonic transducer, comprising:
a piezoelectric composite layer configured to be in acoustic communication with a sample and having at least partially decoupled acoustic impedance and electrical impedance properties, the piezoelectric composite layer comprising:

an array of spaced-apart piezoelectric regions defining a layer having a proximal surface and a distal surface, each spaced-apart piezoelectric region being made from a piezoelectric material, wherein each spaced-apart piezoelectric region is separated one from another by a gap, the gap only extending between the proximal surface and the distal surface of the layer;

a filler material positioned in the gap, between adjacent spaced-apart piezoelectric regions, the filler material comprising a polymer matrix; and a non-piezoelectric material in contact with the polymer matrix;

an electrically insulating non-piezoelectric composite layer extending over the piezoelectric composite layer for electrically insulating the piezoelectric composite layer from the sample, the electrically insulating non-piezoelectric composite layer being acoustically matched to the piezoelectric composite layer and the sample; and one or more electrodes in electrical communication with the piezoelectric composite layer.

16. The ultrasonic transducer of claim 15, wherein the electrically insulating non-piezoelectric composite layer comprises high acoustic impedance electrically insulating material regions in contact with a second polymer matrix.

17. The ultrasonic transducer of claim 15, wherein the electrically insulating non-piezoelectric composite layer comprises electrically insulating ceramic regions in contact with a second polymer matrix.

18. The ultrasonic transducer of claim 15, wherein the electrically insulating non-piezoelectric composite layer comprises electrically insulating glass regions in contact with a second polymer matrix.

19. The ultrasonic transducer of claim 15, wherein:

the piezoelectric composite layer is configured to generate a probing acoustic signal towards the sample and the one or more electrodes are operable to send a probing electrical signal to the piezoelectric composite layer, thereby generating the probing acoustic signal; and the piezoelectric composite layer is configured to receive a sample acoustic signal emanating from the sample, thereby generating a sample electrical signal towards the one or more electrodes, the sample electrical signal being representative of the sample acoustic signal.

20. The ultrasonic transducer of claim 15, further comprising one or more electrically insulating regions positioned between adjacent spaced-apart piezoelectric regions, the one or more electrically insulating regions being in contact with the filler material, the one or more electrically insulating regions having a second acoustic impedance and an electrical relative permittivity, the second acoustic impedance being close to the acoustic impedance.

21. The ultrasonic transducer of claim 20, wherein the one or more electrically insulating regions are made from a material selected from ceramic or glass.

22. The ultrasonic transducer of claim 15, wherein the non-piezoelectric material is embedded within the polymer matrix.

23. The ultrasonic transducer of claim 15, wherein the acoustic impedance property ranges from about 15 MR to about 30 MR.

* * * * *